(12) United States Patent
Ivansen et al.

(10) Patent No.: US 9,291,902 B2
(45) Date of Patent: *Mar. 22, 2016

(54) METHOD AND APPARATUS FOR MERGING MULTIPLE GEOMETRICAL PIXEL IMAGES AND GENERATING A SINGLE MODULATOR PIXEL IMAGE

(71) Applicant: Micronic MyData AB, Taby (SE)

(72) Inventors: Lars Ivansen, Solna (SE); Anders Osterberg, Taby (SE)

(73) Assignee: Mycronic AB, Taby (SE)

( * ) Notice: Subject to any disclaimer, the term of this patent is extended or adjusted under 35 U.S.C. 154(b) by 31 days.

This patent is subject to a terminal disclaimer.

(21) Appl. No.: 14/028,390

(22) Filed: Sep. 16, 2013

(65) Prior Publication Data

US 2014/0170566 A1 Jun. 19, 2014

Related U.S. Application Data

(63) Continuation of application No. 13/039,206, filed on Mar. 2, 2011, now Pat. No. 8,539,395.

(60) Provisional application No. 61/311,276, filed on Mar. 5, 2010.

(51) Int. Cl.
*G03F 7/20* (2006.01)
*G06F 17/50* (2006.01)

(52) U.S. Cl.
CPC .......... *G03F 7/2051* (2013.01); *G03F 7/70291* (2013.01); *G03F 7/70508* (2013.01); *G03F 7/70541* (2013.01); *G06F 17/50* (2013.01)

(58) Field of Classification Search
CPC . G03F 1/144; G03F 7/70433; G03F 7/70441; G03F 7/70125; G03F 7/70283; G03F 1/70; G03F 7/70508; G03F 7/2051; G03F 7/70475; G03F 7/70291; G03F 7/70383; G03F 9/7003

USPC .................. 430/311, 322, 319; 700/103, 121; 716/15

See application file for complete search history.

(56) References Cited

U.S. PATENT DOCUMENTS

| 4,409,686 A | 10/1983 | Ports et al. |
| 4,498,010 A | 2/1985 | Biechler et al. |

(Continued)

FOREIGN PATENT DOCUMENTS

| DE | 19829674 A1 | 1/2000 |
| DE | 10 2008 000967 A1 | 10/2009 |

(Continued)

OTHER PUBLICATIONS

PCT/EP2011/053337—International Search Report and Written Opinion, mailed May 30, 2011, 12 pgs.

(Continued)

*Primary Examiner* — Caleen Sullivan
(74) *Attorney, Agent, or Firm* — Haynes Beffel & Wolfeld LLP

(57) ABSTRACT

The present invention relates to customizing individual workpieces, such as chip, flat panels or other electronic devices produced on substrates, by direct writing a custom pattern. Customization can be per device, per substrate, per batch or at some other small volume that makes it impractical to use a custom mask or mask set. In particular, it relates to customizing a latent image formed in a patterning sensitive layer over a substrate, merging standard and custom pattern data to form a custom pattern used to produce the customized latent image. A wide variety of substrates can benefit from the technology disclosed.

11 Claims, 5 Drawing Sheets

(56) References Cited

U.S. PATENT DOCUMENTS

| | | |
|---|---|---|
| 4,547,882 A | 10/1985 | Tanner |
| 4,619,508 A | 10/1986 | Shibuya et al. |
| 4,879,605 A | 11/1989 | Warkentin et al. |
| 4,989,255 A | 1/1991 | Manns et al. |
| 5,103,101 A | 4/1992 | Berglund et al. |
| 5,115,477 A | 5/1992 | Groezinger |
| 5,148,157 A | 9/1992 | Florence |
| 5,278,949 A | 1/1994 | Thayer |
| 5,294,812 A | 3/1994 | Hashimoto et al. |
| 5,307,207 A | 4/1994 | Ichihara |
| 5,327,338 A | 7/1994 | Allen et al. |
| 5,340,700 A | 8/1994 | Chen et al. |
| 5,393,987 A | 2/1995 | Abboud et al. |
| 5,418,796 A | 5/1995 | Price et al. |
| 5,495,279 A | 2/1996 | Sandstrom et al. |
| 5,504,504 A | 4/1996 | Markandey et al. |
| 5,506,941 A | 4/1996 | Kurumida |
| 5,523,193 A | 6/1996 | Nelson |
| 5,533,170 A | 7/1996 | Teitzel et al. |
| 5,539,567 A | 7/1996 | Lin et al. |
| 5,539,568 A | 7/1996 | Lin et al. |
| 5,673,379 A | 9/1997 | Diehl |
| 5,729,625 A | 3/1998 | Miyake |
| 5,754,618 A | 5/1998 | Okamoto et al. |
| 5,896,438 A | 4/1999 | Miyake et al. |
| 5,959,763 A | 9/1999 | Bozler et al. |
| 5,963,881 A | 10/1999 | Kahn et al. |
| 6,201,545 B1 | 3/2001 | Wong et al. |
| 6,201,559 B1 | 3/2001 | Wada et al. |
| 6,222,650 B1 | 4/2001 | Long |
| 6,261,728 B1 | 7/2001 | Lin et al. |
| 6,281,931 B1 | 8/2001 | Tsao et al. |
| 6,285,488 B1 | 9/2001 | Sandstrom et al. |
| 6,312,134 B1 | 11/2001 | Jain et al. |
| 6,335,151 B1 | 1/2002 | Ausschnitt et al. |
| 6,414,706 B1 | 7/2002 | Allen et al. |
| 6,504,644 B1 | 1/2003 | Sandstrom |
| 6,605,816 B2 | 8/2003 | Sandstrom et al. |
| 6,608,698 B1 | 8/2003 | Lyons et al. |
| 6,618,185 B2 | 9/2003 | Sandstrom et al. |
| 6,687,041 B1 | 2/2004 | Sandstrom et al. |
| 6,717,097 B1 | 4/2004 | Sandstrom et al. |
| 6,813,058 B1 | 11/2004 | Sandstrom |
| 6,813,062 B2 | 11/2004 | Sandstrom |
| 6,813,182 B2 | 11/2004 | Perlov et al. |
| 6,833,854 B1 | 12/2004 | Sandstrom et al. |
| 6,870,172 B1 | 3/2005 | Mankos et al. |
| 6,913,182 B2 | 7/2005 | Stoops |
| 6,963,434 B1 | 11/2005 | Latypov |
| 7,106,490 B2 | 9/2006 | Sandstrom et al. |
| 7,154,516 B2 | 12/2006 | Kawahara et al. |
| 7,158,280 B2 | 1/2007 | Sandstrom |
| 7,167,296 B2 | 1/2007 | Meisburger |
| 7,184,109 B2 | 2/2007 | Hoke et al. |
| 7,186,486 B2 | 3/2007 | Walford et al. |
| 7,215,409 B2 | 5/2007 | Sandstrom |
| 7,295,362 B2 | 11/2007 | Meisburger |
| 7,328,425 B2 | 2/2008 | Olsson et al. |
| 7,394,584 B2 | 7/2008 | Latypov |
| 7,405,414 B2 | 7/2008 | Sandstrom |
| 7,500,218 B2 | 3/2009 | Troost et al. |
| 7,508,570 B1 | 3/2009 | Meisburger |
| 7,589,819 B2 | 9/2009 | Baba-Ali |
| 7,639,416 B2 | 12/2009 | Meisburger |
| 7,713,667 B2 | 5/2010 | Latypov et al. |
| 7,719,744 B2 | 5/2010 | Won et al. |
| 7,719,753 B2 | 5/2010 | Meisburger |
| 7,728,956 B2 | 6/2010 | Bleeker et al. |
| 7,842,525 B2 | 11/2010 | Sandstrom |
| 7,889,411 B2 | 2/2011 | Latypov |
| 7,971,159 B2 | 6/2011 | Taniguchi et al. |
| 7,981,742 B2 | 7/2011 | Chien et al. |
| 8,278,635 B2 | 10/2012 | Platzgummer et al. |
| 8,405,816 B2 | 3/2013 | Hirukawa et al. |
| 8,531,755 B2 | 9/2013 | Sandstrom et al. |
| 8,539,395 B2 * | 9/2013 | Ivansen et al. ............... 716/55 |
| 8,598,544 B2 | 12/2013 | Van De Peut et al. |
| 2002/0122109 A1 | 9/2002 | Ehsani et al. |
| 2002/0135592 A1 | 9/2002 | Slavin |
| 2002/0136446 A1 | 9/2002 | Slavin |
| 2003/0038811 A1 | 2/2003 | Gritz et al. |
| 2003/0043359 A1 | 3/2003 | Naulleau |
| 2003/0107770 A1 | 6/2003 | Klatchko et al. |
| 2003/0202233 A1 | 10/2003 | Sandstrom |
| 2004/0053143 A1 | 3/2004 | Sandstrom |
| 2004/0227767 A1 | 11/2004 | Baroncelli et al. |
| 2004/0251430 A1 | 12/2004 | Sandstrom |
| 2005/0053850 A1 | 3/2005 | Askebjer et al. |
| 2005/0128367 A1 | 6/2005 | Hoke et al. |
| 2005/0219502 A1 | 10/2005 | Sandstrom et al. |
| 2006/0033902 A1 | 2/2006 | Latypov et al. |
| 2006/0068334 A1 | 3/2006 | Sandstrom et al. |
| 2006/0103914 A1 | 5/2006 | Sandstrom |
| 2006/0216869 A1 | 9/2006 | Huizer et al. |
| 2006/0221320 A1 | 10/2006 | Bleeker et al. |
| 2007/0209029 A1 | 9/2007 | Ivonin et al. |
| 2008/0127031 A1 | 5/2008 | Olsson et al. |
| 2008/0184921 A1 | 8/2008 | Trobaugh |
| 2008/0204858 A1 | 8/2008 | Won et al. |
| 2008/0260283 A1 | 10/2008 | Ivansen et al. |
| 2008/0267508 A1 | 10/2008 | Steffensen |
| 2009/0213350 A1 | 8/2009 | Sogard |
| 2010/0001330 A1 | 1/2010 | Chien et al. |
| 2010/0142838 A1 | 6/2010 | Ivansen et al. |
| 2011/0213484 A1 | 9/2011 | Wahlsten et al. |
| 2011/0213487 A1 | 9/2011 | Wahlsten et al. |
| 2011/0216302 A1 | 9/2011 | Luberek |
| 2012/0218571 A1 | 8/2012 | Kan |

FOREIGN PATENT DOCUMENTS

| | | |
|---|---|---|
| EP | 0434141 A1 | 6/1991 |
| EP | 1083462 | 3/2001 |
| EP | 1695139 A2 | 8/2006 |
| EP | 2037488 A1 | 3/2009 |
| EP | 2228817 A2 | 9/2010 |
| JP | 60107832 A | 6/1985 |
| JP | 63283021 | 11/1988 |
| JP | 4252666 A | 9/1992 |
| JP | 6066890 A | 3/1994 |
| JP | 8313842 | 11/1996 |
| JP | 11 271213 A | 10/1999 |
| JP | 11329961 A | 11/1999 |
| JP | 2002169109 A | 6/2002 |
| JP | 2002196275 A | 7/2002 |
| JP | 2006058882 A | 3/2006 |
| JP | 2006292866 A | 10/2006 |
| JP | 2007501431 A | 1/2007 |
| JP | 2007123800 A | 5/2007 |
| JP | 2011095755 A | 5/2011 |
| JP | 4753941 B2 | 8/2011 |
| JP | 4753942 B2 | 8/2011 |
| WO | 9945435 | 9/1999 |
| WO | 9945439 A1 | 9/1999 |
| WO | 9945440 A1 | 9/1999 |
| WO | 9945441 | 9/1999 |
| WO | 01/93303 | 12/2001 |
| WO | 03/023488 A1 | 3/2003 |
| WO | 2006109709 A1 | 10/2006 |
| WO | 2008009973 A1 | 1/2008 |
| WO | 2009 025845 A1 | 2/2009 |
| WO | 2010134017 A1 | 11/2010 |

OTHER PUBLICATIONS

PCT/EP2011/053337—International Preliminary Report on Patentability and Reply to Written Opinion, mailed Jun. 21, 2012, 13 pgs.

PCT/EP2011/053335—International Search Report and Written Opinion, mailed Jun. 7, 2011, 11 pgs.

PCT/EP2011/053335—International Preliminary Report on Patentability, mailed Jun. 21, 2012, 11 pages.

U.S. Appl. No. 14/158,742—Non Final Office Action dated May 12, 2014, 7 pages.

(56) References Cited

OTHER PUBLICATIONS

Seong-Yong-Moon, et al., "Analysis of Photomask Distortion Caused by Blank Materials and Open Rations," in Proceedings of the 20th Annual BACUSSymposium on Photomask Tech. And Management, SPIE vol. 4186, Jan. 2001, 6 pages.

Dodgson, N.A., "Image Resampling," Wolfson College & Computer Laboratory, University of Cambridge, Technical Report No. 261 (Aug. 1992), 264 pages.

Rieger, M.L., et al., "Image quality enhancements for raster scan lithography" in Proceedings of SPIE, Optical/Laser Microlithography, vol. 922, Mar. 2-4, 1988, 11 pages.

Newman, T. et al., "Evaluation of OPC Mask Printing with a Raster Scan Pattern Generator," Proceeding of SPIE, vol. 4691, Optical Microlithography XV, Jul. 2002, pp. 1320-1330.

McCarthy, A.M. et al., "A Novel Technique for Detecting Lithographic Defects," IEEE Transactions on Semiconductor Manufacturing, vol. 1, No. 1, Feb. 1988, pp. 10-15.

Rieger, M.L. et al., "Lithographic Alternatives to PSM Repair," Proceedings of SPIE, vol. 1674, Optical/Laser Microlithography V, 1992, pp. 609-617.

Stephanakis, A.C. et al., "Advances in 1:1 Optical Lithography," Proceedings of SPIE, Optical Microlithography VI, vol. 772. pp. 74-85 (1987).

Wolf, S., "Advanced Lithography," Silicon Processing for the VLSI Era—vol. 1, Process Technology, Lattice Press, Inc., 1986, pp. 493-513.

JP 2005-052909, English Abstract of Application filed Jan. 27, 2005, 2 pages.

PCT/EP2011/053339—International Search Report, mailed May 30, 2011.

Mosher L et al.: "Double-Exposure Grayscale Photolithography", Journal of Microelectromechanical systems, IEEE Service Center, Piscataway, NJ, US, vol. 18, No. 2, Apr. 1, 2009, pp. 308-315.

PCT/EP2009/063831—International Search Report and Written Opinion of the International Searching Authority, dated Apr. 27, 2010, 14 pgs.

Eklund, et al., "Improved CD uniformity for advanced masks using the Sigma7500 pattern generator and ProcessEqualizer," European Mask and Lithography Conf 2007, International Society for Optics and Photonics, 2007, 10 pages.

Haddleton, et al., "Integrating real-time CD corrections into a laser pattern generator," In Photomask and Next Generation Lithography Mask Technology IX, International Society for Optics and Photonics, 2002, pp. 717-726.

Hellgren, "Reducing Process Contributions to CD error range using the Sigma7500 Pattern Generator and Processequalizertm," Photomask and Next Generation Lithography Mask Technology XIII. International Society for Optics and Photonics, 2006, pp. 62831I-62831I-11.

Osterberg, et al., "Embedded optical proximity correction for the Sigma7500 DUV mask writer," In Photomask and Next-Generation Lithography Mask Technology XIV, International Society for Optics and Photonics, 2007, pp. 660704-660704.

Sjoberg, "Sigma7500: an improved DUV laser pattern generator addressing sub-100-nm photomask accuracy and productivity requirements." In Photomask and Next Generation Lithography Mask Technology XIII, International Society for Optics and Photonics, 2006, pp. 628305--1-628305--9.

PCT/EP2009/066411—International Search Report and Written Opinion, dated Mar. 18, 2010, 13 pgs.

JP 2011-539038, Office Action dated Nov. 25, 2014, 4 pages.

U.S. Appl. No. 13/039,206—Non Final Office Action dated Oct. 2, 2012, 6 pages.

PCT/SE1999/000310—International Search Report mailed on Jun. 28, 1999.

PCT/SE2005/000002—International Preliminary Report on Patentability dated Jan. 30, 2006.

PCT/SE2005/000002—PCT communication mailed on Oct. 24, 2005.

PCT/SE2005/000002—Response to Sep. 7, 2005 Written Opinion dated Sep. 13, 2005.

PCT/SE2005/000002—Written Opinion of International Searching Authority mailed on Jul. 7, 2005.

PCT/SE2005/000002, International Search Report mailed on Jul. 7, 2005.

JP 2006-549183, English Translation of Official Action mailed Aug. 7, 2009.

* cited by examiner

METHOD AND APPARATUS FOR MERGING MULTIPLE GEOMETRICAL PIXEL IMAGES AND GENERATING A SINGLE MODULATOR PIXEL IMAGE

RELATED APPLICATIONS

This application is related to and claims the benefit of U.S. Provisional Application No. 61/311,276 by the same title as this. The priority application is incorporated by reference. It is a continuation of U.S. Pat. No. 8,539,395 issuing on Sep. 17, 2013 by the same title. This application is further related to U.S. Pat. No. 7,328,425 entitled "Method and Device for Correcting SLM Stamp Image Imperfections", U.S. Pat. No. 7,405,414 entitled "Method and Apparatus for Patterning a Workpiece", and U.S. Pat. No. 7,842,525 entitled "Method and Apparatus for Personalization of Semiconductor". It is further related to U.S. Patent Publication No. 2010/0142838 A1 entitled "Gradient Assisted Resampling in Micro-Lithographic Printing". It is also related to U.S. Patent Publication No. 2011/0216302 entitled "Illumination Methods and Devices for Partially Coherent Illumination". The related patents, patent publication, and patent application are hereby incorporated by reference.

BACKGROUND OF THE INVENTION

The present invention relates to customizing individual workpieces, such as chips, flat panels or other electronic devices produced on substrates, by direct writing a custom pattern. Customization can be per device, per substrate, per batch or at some other small volume that makes it impractical to use a custom mask or mask set. In particular, it relates to customizing a latent image formed in a radiation sensitive layer over a substrate, merging standard and custom pattern data to form a custom pattern used to produce the customized latent image. A wide variety of substrates can benefit from the technology disclosed.

It is sometimes useful to permanently load an integrated circuit with custom, personalized or unique information. This usefulness has led to the development of a variety of one-time programmable or write-once memories. One example is found in U.S. Pat. No. 6,813,182, entitled "Diode-and-Fuse Memory Elements for a Write-Once Memory Comprising an Anisotropic Semi Conductor Sheet." The crosspoint memory element described can be converted from a fuse-intact state to fuse-blown state only once, thereby providing a write-once memory.

Another example is found in U.S. Patent Publication 2010/0001330A1, entitled "Semi Conductor Device, Data Element Thereof and Method of Fabricating the Same." That application describes nonvolatile memories in categories of factory programmed ROMs, also called mask ROMs, and field programmable memories.

In contrast to the fused memory approaches, the development team at Micronic Laser/Micronic Mydata has previously proposed combining the features of a stepper with an SLM to optically merge standard data from a mask and custom data from the SLM. Two patents issued in this area of technology include U.S. Pat. Nos. 6,813,058 and 7,842,525, both entitled "Method and Apparatus for Personalization of Semiconductor."

Accordingly, there is an opportunity to provide new technology for permanently loading an integrated circuit with custom, personalized or unique information. New technologies may be better integrated into production, more reliable, more flexible or more cost-effective.

SUMMARY OF THE INVENTION

The present invention relates to customizing individual workpieces, such as integrated circuits, flat panels or other electronic devices produced on substrates, by direct writing a custom pattern. Customization can be per device, per substrate, per batch or at some other small volume that makes it impractical to use a custom mask or mask set. In particular, it relates to customizing a latent image formed in a radiation sensitive layer over a substrate, merging standard and custom pattern data to form a custom pattern used to produce the customized latent image. A wide variety of substrates can benefit from the technology disclosed. Particular aspects of the present invention are described in the claims, specification and drawings.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

Figure 4:
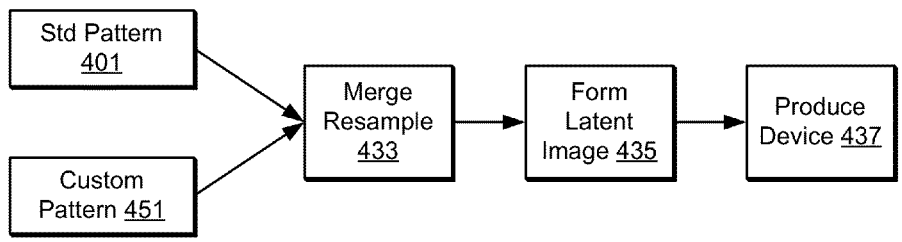
FIG. 4 is a high level block diagram of a data flow that merges standard and custom pattern data.
Figure 5:
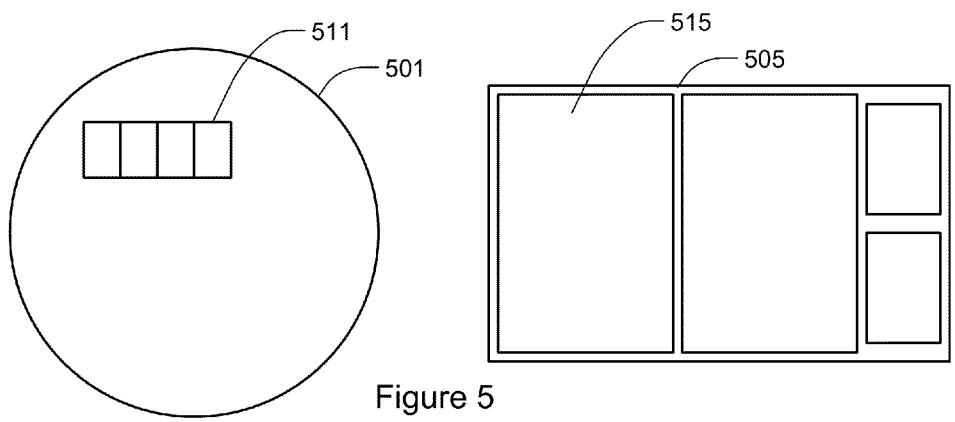
FIG. 5 illustrates a circular wafer and a rectangular substrate on which multiple dies are formed.
Figure 6:
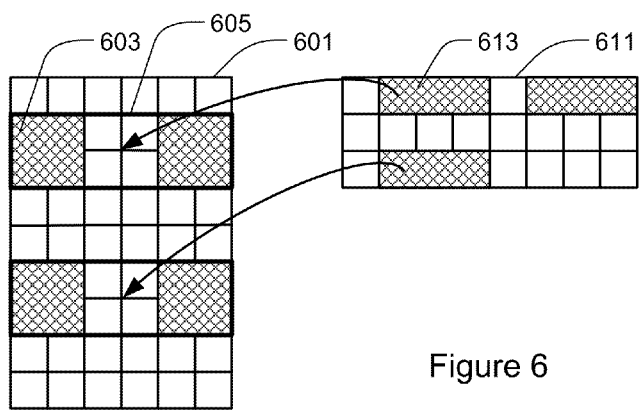
FIG. 6 depicts grids of different pixel size and tile size.

FIGS. 4-6 disclose resampling and merging of standard and custom data and using the merged data to form a latent image in a radiation sensitive layer over a substrate by direct writing device for at least one layer. Unlike the mixed stepper-SLM technology disclosed in U.S. Pat. Nos. 6,813,058 and 7,842,525, this technology uses direct writing technology for at least one layer and is compatible with using a stepper technology or any preferred pattern generator for other layers.

FIG. 4 is a high level block diagram of a data flow that merges standard and custom pattern data. A merging and resampling component 433 receives standard pattern data 401 and custom pattern data 431 on two data paths. The data paths may be physically separate or interleaved, as on a single data bus or memory access channel. By "data path," we mean to refer to how data is delivered to the resampling and merging component 433. The data may come from vector or raster data and may be stored on rotating or non-rotating memory.

Design data, typically a vector data set, is converted into a common vector format for manufacturing. Vector domain geometry processing is applied in this format. The vector format is then rendered into a geometrical pixel map, producing what we refer to as "standard pattern data". Pixel domain image processing is applied and the data is resampled into a modulator dependent format for printing.

For batch printing, where many identical or nearly identical panels are produced, it is beneficial to reuse previously generated data, to avoid redoing the same work multiple times. However, in the progression of image format versions, the final modulator pixel map cannot be reused, because it carries compensations that are unique to a particular panel being imaged. Examples of such compensation include alignment information and distortion compensation. Standard pattern data may be generic across multiple panels and reused, or it may just be the base data to which customization is applied. Reuse across panels means that the geometrical map is generated once, and then the same map is reused for multiple panels in a batch. That way, the computational effort is lower and the hardware configuration can be smaller compared to when the geometrical map has to be regenerated for each panel. The geometrical map can be produced long before the actual printing is performed. Actually, multiple geometrical maps can be prepared in advance and archived for later use. This scheme also permits inspection of the map prior to printing.

Reusable standard pattern data inherently makes panels identical, which typically is desirable. However, there are use cases in which individuality is desired for some panel, or parts of some panel, such as substrates for packaging purposes or memory elements for programming purposes. Examples of individuality include unit serial numbers, manufacturing batch or time and date, manufacturing substrate or other manufacturing data. There are other cases in which edges of a die require different patterns than the main field of the die, for instance in large area masks. For these purposes, a second pixel map of custom pattern data can be used. We disclose merging and resampling the standard pattern data with the custom pattern data, for instance at the time when the data is being used to form latent images.

The merging can be performed at various times, before or after resampling. Accordingly, merging and resampling are represented by a single component and may be claimed as a single action, because the order of merging and resampling depends on the nature of the standard and custom pattern data. In some use cases, the merging can be done before resampling, allowing the processing to be performed off-line, where time is less critical. Then, on-line processing is more nearly time-wise deterministic, allowing optimization of compute power. The resampling operation transforms one input map into one output map, which simplifies the resampling operation. The combined pixel maps can be accessed for inspection prior to printing.

When merging is performed during resampling, the custom pattern data pixel maps can be generated immediately before printing, immediately before the modulator pixel map is generated. One example of recent custom pattern data generated near the time of production the exact production time to be merged into the pattern.

When merging is performed after resampling, the additional pixel maps may also be merged into an existing modulator pixel map. This can be beneficial when the data flow is partitioned in a way that requires a merge of multiple modulator pixel maps prior to printing.

During merging, the custom pattern data can be tested to determine whether any customization is required in a particular area, frame or tile. If there is no customization, the merge can be optimized, whether by bypassing the merge altogether or performing a merge that will not change the pixel values in the standard pattern data. If there is no customization, there may be little or no custom pattern data to process.

The merge between the standard pattern data in the base geometrical pixel map and the custom pattern data in additional geometrical pixel map(s) can be performed for matching or much different pixel grids. First, identical and aligned pixel grids can be merged. In the simplest form, the merge is performed on multiple pixel maps where the grids and tiles are matching, i.e., the pixel dimensions and the alignment of the maps are identical. In this case, the merged can be performed before resampling, pixel-to-pixel, with a simple merge operation. Alternative merge operations are described below.

Second, identical but offset pixel grids can be merged. Here, the grids of the multiple pixel maps have the same pixel dimensions, but are offset so that a single pixel in one map does not correspond to a single pixel in the other map. In this case, the offset can be removed by snapping the offset of the additional maps to match the base map. Then the merge is performed before resampling, pixel-to-pixel, with a simple merge operation. Or, multiple adjoining pixels in the additional map can be resampled to decide the value of the resulting pixel to be merged.

Third, non-matching pixel grids can be merged. This is illustrated in FIG. 6, which depicts grids of different pixel size and tile size. In this illustration, the standard pattern data is in grid 601 and the custom pattern data is in grid 611. Three pixels of custom data 613 fit over twelve pixels of standard data 605. A connecting pattern 613 overlays pads 603 of an open gap. This is a simplification of programming a custom pattern of ones and zeros as closed and open connections. When the pixel grids are not matching, either by pitch or offset, the merge can be performed by resampling the images to a common grid and tile. Or, multiple grids could be resampled at the same time and the resampling results merged.

When pixel grids match, the merge can be done pixel-by-pixel with a simple one-to-one merge operation. Depending on the data involved, different merge operations can be used, such as Replace, Add, Subtract, XOR, AND, OR. The operations Replace, Add and Subtract can be used for pixels are represented by floating point or integer values, but the logical operations are difficult to apply to floating point values, due to exponent scaling. If the pixels are represented by integer values, any of these merge operations can be applied.

Workpieces that can benefit from custom pattern data include silicon or semiconductor wafers, circuit boards, flat-panel displays and substrates of flexible material used in roll-to-roll production. FIG. 5 illustrates a circular wafer 501 and a rectangular substrate on which multiple dies 511, 515 are formed. The dies are separated to form chips or flat panel substrates.

Figure 1:
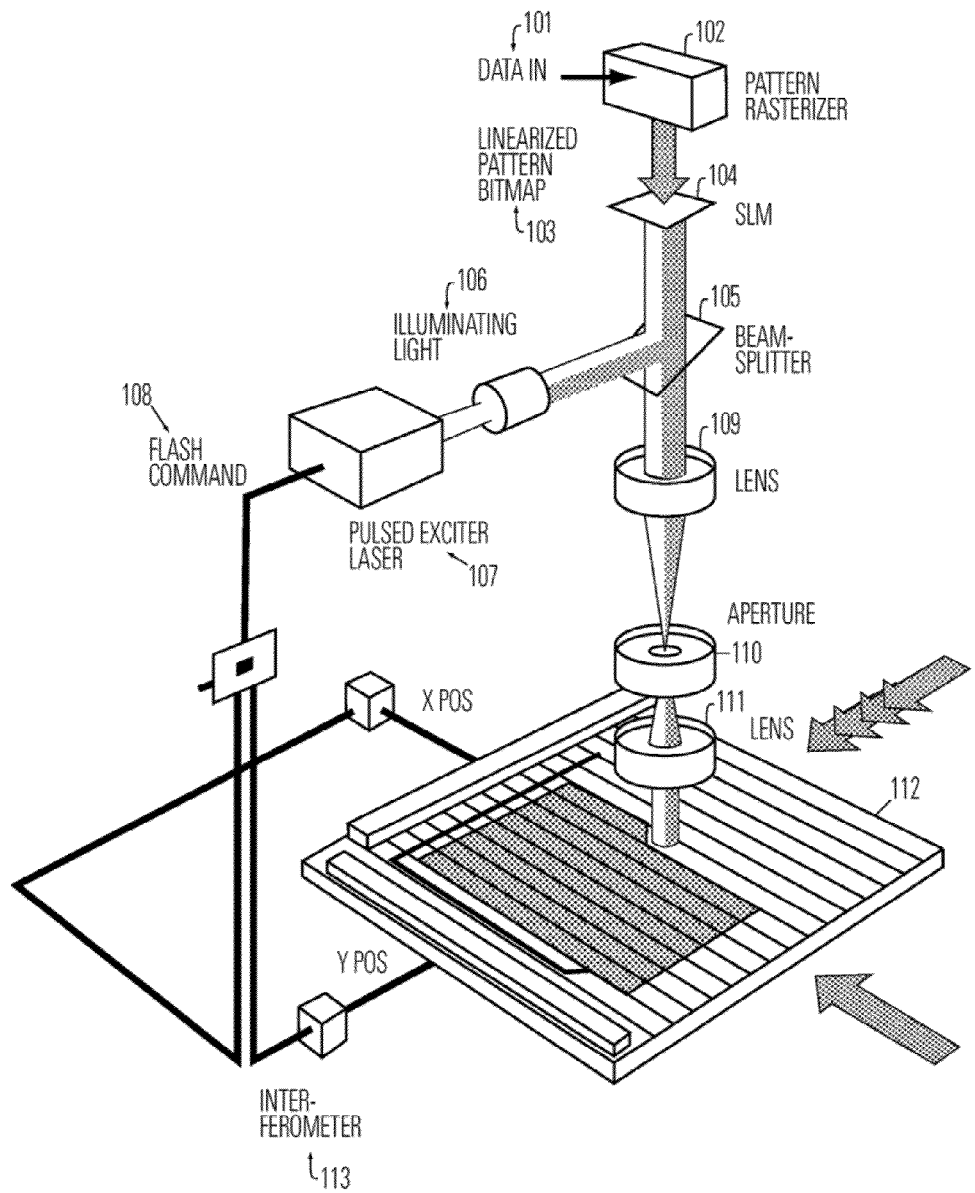
FIG. 1 depicts the general layout of an SLM pattern generator.
Figure 2:
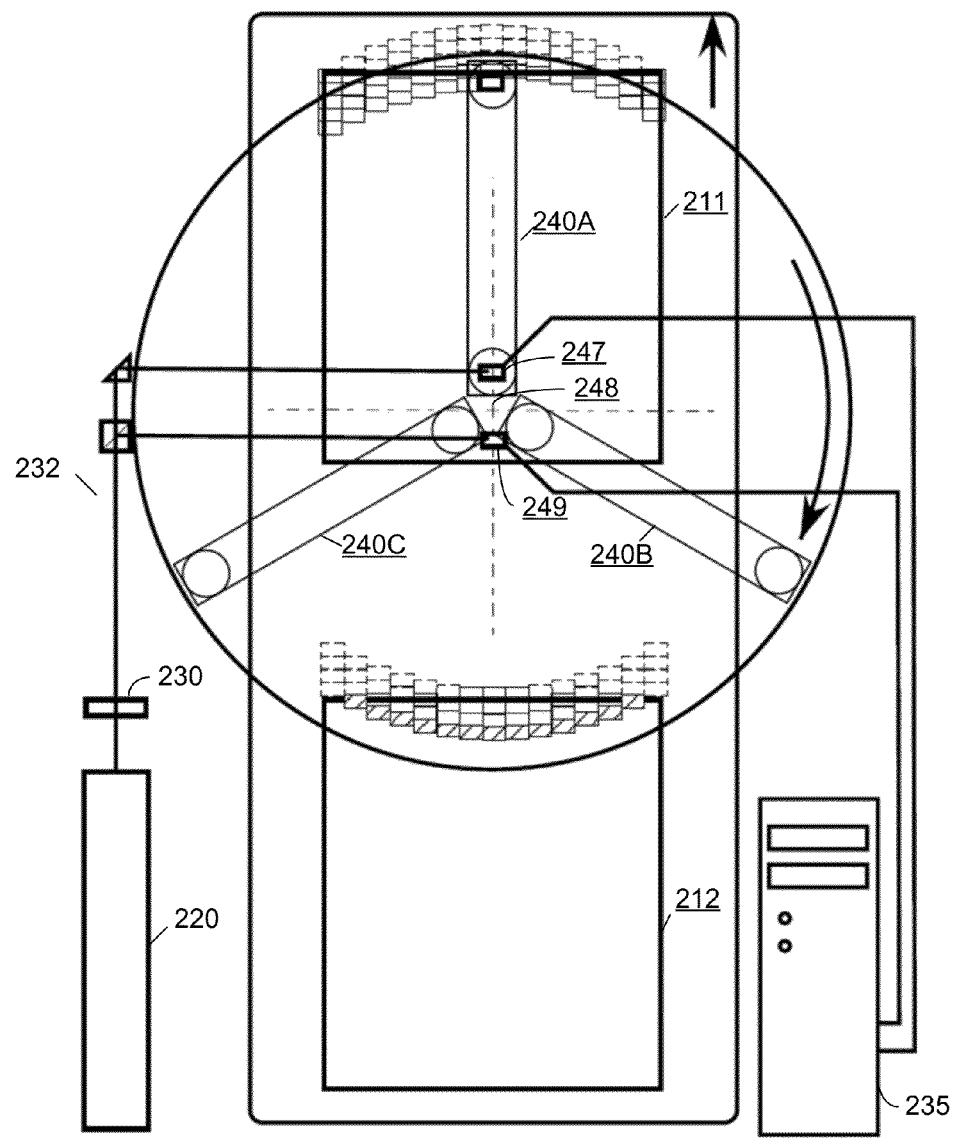
FIG. 2 depicts a scanning system with three arms and a pair of workpieces being written on opposite sides of the hub.
Figure 7:
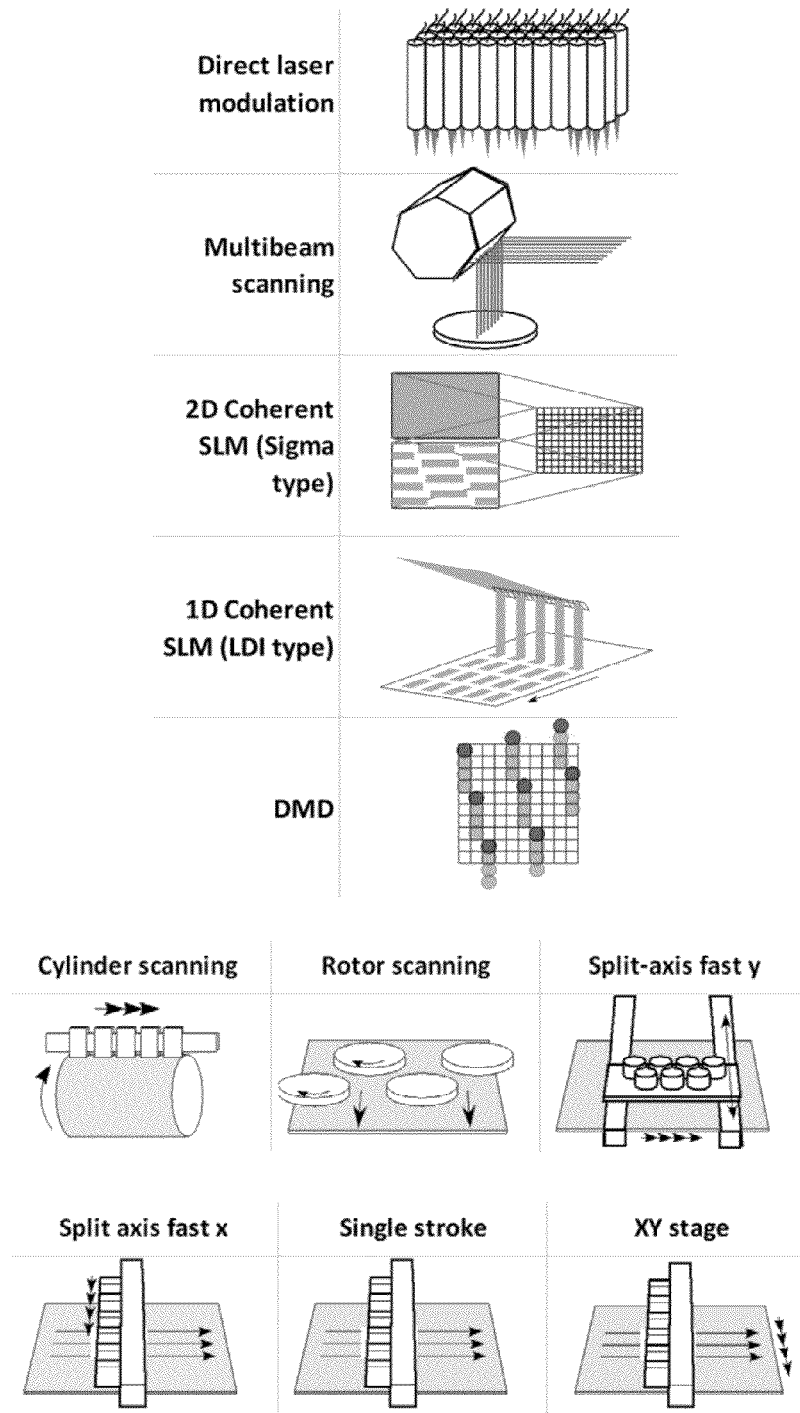
FIG. 7 depicts a variety of modulator and stage types used for producing latent images.

The customization technology disclosed can be applied in a variety of environments. The Micronic Laser development team has pioneered a variety of platforms for microlithographic printing. An established platform for the Sigma machine is depicted in FIG. 1. A rotor printing platform described in recently filed patent applications is depicted in FIG. 2. A drum printing platform is described in other patent applications. FIG. 7 depicts a variety of modulator and stage types used for producing latent images. Some of these modulators and stages are currently in use and others have yet to be developed. In addition to the systems depicted, scanner-based direct writing also have been described, particularly in collaborative work of Micronic Laser and ASML.

In the following paragraphs, we describe two environments that use a 2D SLM, which may benefit from use of the technology disclosed.

FIG. 1 depicts the general layout of an SLM pattern generator with a of xy stage. The workpiece to be exposed sits on a stage 112. The position of the stage is controlled by precise positioning device, such as paired interferometers 113.

The workpiece may be an integrated circuit or flat panel with a layer of resist or other exposure sensitive material. In the first direction, the stage moves continuously. In the other direction, generally perpendicular to the first direction, the stage either moves slowly or moves in steps, so that stripes of stamps are exposed on the workpiece. In this embodiment, a flash command 108 is received at a pulsed Excimer laser source 107, which generates a laser pulse. This laser pulse may be in the deep ultraviolet (DUV) or extreme ultraviolet (EUV) spectrum range. The laser pulse is converted into an illuminating light 106 by a beam conditioner or homogenizer. Applying the technology disclosed herein, a continuous laser with the illuminator described could be substituted for the pulsed laser, especially with the workpiece tracking optics.

A beam splitter 105 directs at least a portion of the illuminating light to an SLM 104. The pulses are brief, such as only 20 ns long, so any stage movement is frozen during the flash. The SLM 104 is responsive to the datastream 101, which is processed by a pattern rasterizer 102. In one configuration, the SLM has 2048×512 mirrors that are 16×16 μm each and have a projected image of 80×80 nm. It includes a CMOS analog memory with a micro-mechanical mirror formed half a micron above each storage node.

The electrostatic forces between the storage nodes and the mirrors actuate the mirrors. The device works in diffraction mode and needs to deflect the mirrors by only a quarter of the wavelength (62 nm at 248 nm) to go from the fully on-state to the fully off-state. To create a fine address grid the mirrors are driven to on, off and 63 intermediate values. The pattern is stitched together from millions of images of the SLM chip. Flashing and stitching proceed at a rate of 1000 stamps per second. To eliminate stitching and other errors, the pattern is written four times with offset grids and fields. Furthermore, the fields may be blended along the edges.

The mirrors are individually calibrated. A CCD camera, sensitive to the Excimer light, is placed in the optical path in a position equivalent to the image under the final lens. The SLM mirrors are driven through a sequence of known voltages and the response is measured by the camera. A calibration function is determined for each mirror, to be used for real-time correction of the grey-scale data during writing. In the data path, the vector format pattern is rasterized into grey-scale images, with grey levels corresponding to dose levels on the individual pixels in the four writing passes. This image can then be processed using image processing. The final step is to convert the image to drive voltages for the SLM. The image processing functions are done in real time using programmable logic. Through various steps that have been disclosed in the related patent applications, rasterizer pattern data is converted into values 103 that are used to drive the SLM 104.

FIG. 2 depicts a rotor scanning system with three arms and a pair of workpieces 211, 212 being written on opposite sides of the hub 248. A rotary printer as depicted may print 2D images on the workpiece. This system may have a duty cycle of 100%. Each rotor writes through an arc of 60 degrees. Only one arm 240 writes at a time, alternatively on the two workpieces 211 and 212. The laser energy is switched by polarization control 232 between the two SLMs 247 and 249, and the data stream is also switched between the SLMs. Since the laser 220 and the data path 235 are among the most expensive modules in writing machines, this embodiment has been designed to use laser and data channel 100% of the time while the SLMs and the optics in the arms have lower duty cycles, 50% and 33% respectively. This may be, for instance, an example of a writing system with three rotating arms 240A-C. There are a variety of alternative designs for these arms and the relay optics. The figure conceptually depicts a laser 220 and a controller 235 sending data to two SLMs 230 which are relayed 232, 247, 249 to the rotating arms. It shows how each arm moves in front of each SLM and writes a series of concentric stamps on the workpieces 211, 212. While two workpieces are shown in this figure, more workpieces could be positioned under a rotor, depending on its size. While the example is described as a writing system, the direction of relay could just as easily be from the workpiece back to a pair of detectors positioned where the laser 220 is and elsewhere. In alternative configurations, one workpiece might be used; four arms might be used.

Some particularly useful applications of this technology involve writing patterns on electronic substrates, such as: wafers' front and back sides; PCBs; build-up, interposer and flexible interconnection substrates; and masks, stencils, templates and other masters. Likewise, the rotor writer can be used for patterning panels in displays, electronic paper, plastic logic and photovoltaic cells. The patterning can be done by exposure of photoresist, but also through other actions of light such as thermal or photochemical processes: melting, evaporation, ablation, thermal fusing, laser-induced pattern transfer, annealing, pyrolytic and photo induced etching and deposition.

Figure 3:
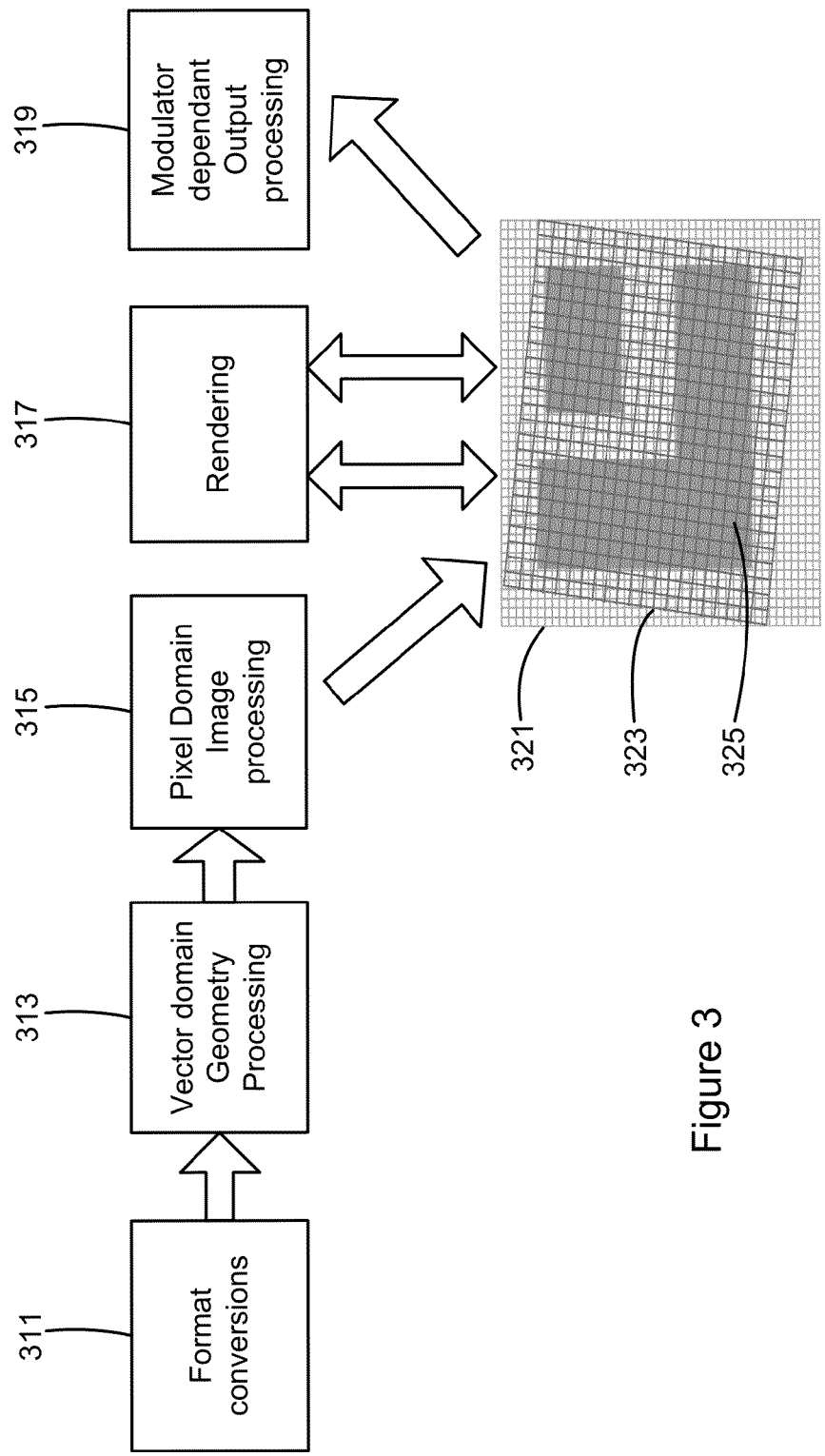
FIG. 3 depicts a generic data path that includes resampling to a modulator grid.

FIG. 3 depicts a generic data path. Data for a pixel-based exposure system that prints in a sequential manner is "flattened" (all data contributing to one pixel aggregated) and localized. The pattern represented as a rendered geometrical pixel map (GPM 121) fulfils these properties and makes a suitable format as intermediate storage.

A re-sampling process converts the GPM into modulator pixels in a modulator pixel map (MPM 123). Image processing and morphological operations can also be applied during this re-sampling process. It is possible to apply the image processing and morphological operations at both local parts of the pattern, such as over the exposure system field of view, or globally over the pattern. The image processing and morphological operations include, but are not limited to, scaling, translation, rotation, distortion and sizing. These operations can be used to compensate both for how the exposure system projects pixels onto the mask/substrate and for properties of the mask/substrate.

Due to fidelity requirements and the potential information loss during the re-sampling process, the intermediate pixel map (GPM 121) has a higher resolution than the Modulator Pixel Map (MPM 123). By using gradient information in the re-sampling process, the memory resolution required to satisfy the requirement of the GPM 121 can be significantly reduced.

The majority of the pattern dependent processing steps are done during generation of the GPM 121. The re-sampling is primarily used to handle localized pattern dependent (morphological) operations. It is advantageous to limit re-sampling to localized pattern dependent operations, as this improves the predictability of computational effort for the re-sampling. Predictable computational effort, in turn, makes it easier to optimize the configuration.

The use of the GPM 121 as intermediate storage enables exposure system independence, since processing steps to generate the GPM 121 can be made generic and independent from an exposure system.

Processing requirements for data paths in high resolution microlithography are very challenging, even using the latest and most capable processing hardware. A contributing factor to success in high resolution processing and in high performance computing (HPC), generally, is parallelization. Parallelizing high resolution processing involves dividing the processing into small pieces. Microlithography applications that use the data paths described, process data that has a geographical property, which works within a coordinate system. One convenient way to divide the task is coordinate oriented.

Processing according to the architecture disclosed can be described in two domains, called off-line and on-line. Processing also operates in different data domains. In this disclosure, we refer to processing to create the geometrical pixel maps 121 as "GPM processing." We refer to resampling of the GPM to create the modulator pixel map 123 as "MPM processing." In the first phase of processing, operations are done in a geometrical coordinate system that is independent of modulator type and geometry. The second phase is adapted to a particular modulator. It produces tiles that are pieces of modulator data arranged according to requirements from modulator.

When discussing the data path, we call the abutting parts of an area, covered by the pattern, "tiles" 510. Tiles can be fully described by geometrical coordinates. We refer to tiles in both the GPM processing and the MPM processing, even though the coordinate systems could be quite different between the two.

In addition to the GPM 121 processing domain and MPM 123 processing domain, a third data domain warrants discussion. The vector data domain precedes rasterization to create the GPM. Therefore, the three different data domains are vector data, pixel data in a consolidated Geometrical Pixel Map (the GPM) 121 and pixel data organized for the modulator (the MPM 123, Modulator Pixel Map).

Some Particular Embodiments

The technology disclosed includes a method of forming a custom latent image in a radiation sensitive layer over a substrate. This method includes receiving standard data on a first data path and receiving custom pattern data on a second data path. We intend for data paths to be broadly construed. Standard pattern data is pattern data that is repeatedly used for multiple dies or areas within a die and for multiple substrates in a batch, subject to customization. Custom pattern data is used to modify the standard pattern data to produce a custom latent image. The method further includes resampling and merging the standard custom pattern data to form a merged-rasterized pattern data that represents the physical, custom latent image to be formed in a radiation sensitive layer. A latent image may be positive or negative, depending on the resist or other radiation sensitive material applied over the substrate. In typical device manufacturing processes, a latent image is developed and parts of the radiation sensitive layer removed to form a pattern. The pattern is used to add or remove material as part of forming electronic devices.

The method further may include forming the custom latent image in the radiation sensitive layer from the merged-rasterized pattern data using a direct writing device. Several samples of direct writing devices are given above and depicted in FIGS. 1-2. In addition, FIG. 5 depicts a wide range of modulator types and scanning stages that could be combined to produce direct writing devices not yet in production. We intend for direct writing device to be broadly construed. The difference between a direct writing device and a more conventional stepper is that the stepper uses a mask or reticle, while the direct writing device uses a modulator as a virtual mask.

The standard and custom pattern data may be on aligned or offset grids. The pattern data of these types may use that the same or different pixel sizes. The simplest case is when the grids are aligned and coincident. Then, a pixel-to-pixel merge can be applied prior to resampling the data. In some instances, it is necessary first to resample the standard and custom pattern data to aligned grids, to facilitate the merge. The order of merging and resampling, thus, depends on the particular data being used to form a custom latent image.

The standard and custom pattern data can be processed in parallel, through separate pipelines. Or, they can be interleaved for data retrieval and/or resampling, then merged.

Optionally, the resampling and merging can be performed in real-time. By real-time, we mean that the merging and/or resampling of the second portion of data for a particular custom latent image happens as a first portion of merged-rasterized pattern data, which is already been subjected to merging and resampling, is being used to form a first portion of the particular custom latent image. In real time, some of the resampling and merging for writing to a substrate is going on while merged-rasterized pattern data is being used to form part of the latent image on the substrate.

As described above, the substrate can take a variety of forms. It can be a silicon or semiconductor wafer, circuit board, flat-panel display, or a flexible substrate used in so-called rule-to-roll production.

The method described can be applied one or more times to pattern one or more layers over the substrate. After latent images are formed, conventional patterning processes are applied to form electronic devices on the substrate. The method may be extended by using these processes to form electronic devices.

The custom data may be unique at a variety of levels. It may be unique to a particular die on a particular substrate, such as a serial number. It may be unique to a particular substrate, such as the time that the printing of the layer begins. Or, it may be unique to a particular batch of substrates, such as a batch control number. Alternatively, custom data may be used with a large regular device, such as a memory chip or a flat-panel display, to finish edges of the pattern or to stitch together adjoining panels.

The technology disclosed also can be practiced as a controller adapted to be linked to data paths and a direct writer. This controller processes standard and custom pattern data according to any of the methods described above. The controller would include memory and a processor, whether a conventional CPU, RISC processor, FPGA, GPU, or other processing logic. Computer instructions are processed to merge and resample the standard and custom pattern data and output it for use by a direct writing device. The controller may be extended by combination with a direct writing device to form a writing system that practices any of the methods described above.

The technology disclosed also can be practiced as non-transitory storage, such as rotating or nonrotating memory, loaded with computer instructions. The computer instructions may either be instructions adapted to carry out any of the methods described above or adapted to be combined with hardware to produce the controller or writing system described above.

We claim as follows:

1. A method of forming a custom latent image in a patterning layer over a substrate, the method including:

receiving standard pattern data on first data path;

receiving custom pattern data on a second data path;

merging the standard and custom pattern data to form a merged-rasterized pattern data that represents a physical, custom latent image to be formed in a patterning layer; and forming the custom latent image in the patterning layer from the merged-rasterized pattern data using a direct writing device.

2. The method of claim 1, further including applying the merging to a second portion of pattern data for a particular custom latent image while a first portion of merged-rasterized pattern data is being used by the direct writing device to form a first portion of the particular custom latent image.

3. The method of claim 2, wherein the substrate is any of a silicon wafer, a semiconductor wafer, a circuit board, or a flat-panel display.

4. The method of claim 2, wherein the substrate is a flexible material used in roll-to-roll production.

5. The method of claim 1, wherein the standard pattern data represents a pattern field that repeats at a plurality of adjoining locations sand the custom data represents a pattern edge.

6. The method of claim 1, wherein the standard pattern data represents a pattern field that repeats at a plurality of adjoining locations and the custom data represents a stitching area between the adjoining locations.

7. The method of claim 1, wherein the substrate is any of a silicon wafer, a semiconductor wafer, a circuit board, or a flat-panel display, further including developing the custom latent image and forming one or more electronic devices from the substrate.

8. The method of claim 1, further including applying the receiving and forming actions one or more times, patterning layers over the substrate using the custom latent images, and forming electronic devices using the patterned layers.

9. The method of claim 1, wherein the custom data is unique to a particular batch of substrates.

10. The method of claim 9, wherein the custom data is unique to a particular substrate.

11. The method of claim 10, wherein the custom data is unique to a particular die on a particular substrate.

* * * * *